(12) United States Patent
Kim

(10) Patent No.: US 7,804,242 B2
(45) Date of Patent: Sep. 28, 2010

(54) TOP-EMISSION ACTIVE MATRIX ELECTROLUMINESCENCE DEVICE AND METHOD FOR FABRICATING THE SAME

(75) Inventor: Hong Gyu Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 233 days.

(21) Appl. No.: 10/909,387

(22) Filed: Aug. 3, 2004

(65) Prior Publication Data

US 2005/0029936 A1 Feb. 10, 2005

(30) Foreign Application Priority Data

Aug. 5, 2003 (KR) ...................... 10-2003-0054149
Aug. 5, 2003 (KR) ...................... 10-2003-0054150

(51) Int. Cl.
*H05B 33/00* (2006.01)

(52) U.S. Cl. .................. 313/506; 313/504; 313/500; 313/505; 428/690

(58) Field of Classification Search .................. None
See application file for complete search history.

(56) References Cited

U.S. PATENT DOCUMENTS

| | | | |
|---|---|---|---|
| 5,677,572 A * | 10/1997 | Hung et al. .................. | 257/750 |
| 6,538,374 B2 * | 3/2003 | Hosokawa .................. | 313/504 |
| 6,608,449 B2 * | 8/2003 | Fukunaga .................. | 315/169.3 |
| 6,806,641 B2 * | 10/2004 | Ueda et al. .................. | 313/506 |
| 7,291,973 B2 * | 11/2007 | Ishihara et al. .................. | 313/505 |
| 7,432,885 B2 * | 10/2008 | Asano et al. .................. | 345/76 |
| 7,474,047 B2 * | 1/2009 | Kim .................. | 313/504 |
| 2002/0033664 A1 * | 3/2002 | Kobayashi .................. | 313/504 |
| 2002/0158835 A1 | 10/2002 | Kobayashi et al. .................. | 345/100 |
| 2003/0137239 A1 * | 7/2003 | Matsuura et al. .................. | 313/503 |
| 2003/0201716 A1 * | 10/2003 | Yamazaki et al. .................. | 313/506 |
| 2004/0160170 A1 * | 8/2004 | Sato et al. .................. | 313/504 |
| 2005/0077814 A1 * | 4/2005 | Koo et al. .................. | 313/500 |

FOREIGN PATENT DOCUMENTS

| | | |
|---|---|---|
| CN | 1307442 A | 8/2001 |
| EP | 1122800 | 8/2001 |
| EP | 1160 891 A2 | 12/2001 |
| EP | 1160891 | 12/2001 |
| EP | 1191820 | 3/2002 |
| EP | 1274130 | 1/2003 |

(Continued)

OTHER PUBLICATIONS

European Search Report Dated Feb. 16, 2005.

(Continued)

*Primary Examiner*—Sikha Roy
(74) *Attorney, Agent, or Firm*—Morgan, Lewis & Bockius LLP

(57) ABSTRACT

A top-emission active matrix electroluminescence device and a method for fabricating the same are disclosed, wherein a counter common electrode is formed in an area outside of a pixel area, when forming a pixel electrode, so as to simultaneously enhance an emission efficiency and an electrical function of the device. Herein, the counter common electrode is electrically connected to a common electrode, thereby preventing an overload and a short-circuit of the common electrode, even though the common electrode is formed in a thin layer.

12 Claims, 11 Drawing Sheets

FOREIGN PATENT DOCUMENTS

| | | |
|---|---|---|
| JP | 2002-318556 | 10/2002 |
| JP | 2002-318556 A | 10/2002 |
| JP | 2003-178875 A | 6/2003 |
| KR | 2002-0000875 | 1/2002 |
| KR | 2003-0064303 | 7/2003 |

OTHER PUBLICATIONS

Korean Office Action.

Office Action issued Feb. 9, 2010 in corresponding Japanese Application No. 2004-228255.

* cited by examiner

TOP-EMISSION ACTIVE MATRIX ELECTROLUMINESCENCE DEVICE AND METHOD FOR FABRICATING THE SAME

CROSS-REFERENCE TO RELATED APPLICATIONS

This application claims the benefit of Korean Application Nos. P2003-054149, filed on Aug. 5, 2003, and P2003-054150, filed on Aug. 5, 2003, which is hereby incorporated by reference as if fully set forth herein.

BACKGROUND OF THE INVENTION

1. Field of the Invention

The present invention relates to an organic electroluminescence device, and more particularly, to a top-emission active matrix electroluminescence device and a method for fabricating the same. Although the present invention is suitable for a wide scope of applications, it is particularly suitable for enhancing the luminous efficiency and improving the electrical function of the device.

2. Discussion of the Related Art

An electroluminescence device is being viewed as a next generation flat display device for its characteristics of a wide viewing angle, a high aperture ratio, and a high chromaticity. More specifically, in an organic electroluminescence (EL) device, when an electric charge is injected into an organic electroluminous layer formed between a hole injection electrode and an electron injection electrode, the electron and the hole are paired to each other generating an exciton, the excited state of which falls to a ground state, thereby emitting light. Thus, the organic electroluminescence device (ELD) can be operated at a lower voltage, as compared to other display devices.

Depending upon the driving method, the organic ELD can be classified into a passivation ELD and an active matrix ELD. The passivation ELD is formed of a transparent electrode on a transparent substrate, an organic electroluminous layer on the transparent electrode, and a cathode electrode on the organic electroluminous layer. The active matrix ELD is formed of a plurality of scan lines and data lines defining a pixel area on a substrate, a switching device electrically connecting the scan lines and the data lines and controlling the electroluminescence device, a transparent electrode (i.e., anode) electrically connected to the switching device and formed in the pixel area on the substrate, an organic electroluminous layer on the transparent electrode, and a metal electrode (i.e., cathode) on the organic electroluminous layer. Unlike the passivation ELD, the active matrix ELD further includes the switching device, which is a thin film transistor (TFT).

The active matrix ELD can be categorized into two types: a top-emission ELD and a bottom-emission ELD. Unlike the bottom-emission ELD, since the top-emission ELD emits light rays towards a metal common electrode (i.e., cathode), the metal common electrode of the top-emission ELD should be formed in a thin layer in order to provide a highly efficient light transmission.

However, if the metal common electrode is formed too thin, the heat applied thereon may cause the metal common electrode to be short-circuited or oxidized. Due to the characteristics of the active matrix ELD, a large amount of electric current constantly flows within the metal common electrode. More specifically, when the metal common electrode is formed of silver (Ag), lumps are formed on the metal common electrode because of the migration of the silver (Ag) atoms. Thus, the reliability of the device is lowered and the durability is reduced.

SUMMARY OF THE INVENTION

Accordingly, the present invention is directed to a top-emission active matrix electroluminescence device and a method for fabricating the same that substantially obviate one or more problems due to limitations and disadvantages of the related art.

An object of the present invention is to provide a top-emission active matrix electroluminescence device and a method for fabricating the same that can simultaneously enhance the luminous efficiency and improve the electrical function of the device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an active matrix electroluminescence device includes a substrate including a thin film transistor and a pixel area defined thereon, an insulating layer formed on the substrate and the thin film transistor, first electrodes formed on the insulating layer, a second electrode formed on the insulating layer between the first electrodes, an emission layer formed on the first electrodes, and a third electrode formed on the emission layer and electrically connected to the second electrode.

The first electrodes are formed in the pixel area and are electrically connected to the thin film transistor through a contact hole. And, the second electrode is formed between each pixel area.

The emission layer is formed of a hole injection layer, a hole transport layer, an organic electroluminous layer, an electron transport layer, and an electron injection layer serially deposited on one another.

The third electrode is either formed of a metal electrode deposited on a transparent electrode or formed of a transparent electrode.

In another aspect of the present invention, a method for fabricating an active matrix electroluminescence device includes forming a thin film transistor on a substrate having a pixel electrode defined thereon, forming an insulating layer on the thin film transistor and the substrate, forming first electrodes and a second electrode on the insulating layer, forming an emission layer on the first electrodes, and forming a third electrode on the emission layer, the third electrode being electrically connected to the second electrode.

The first electrodes and the second electrode are formed of the same material. And, the first electrodes are formed in the pixel area on the insulating layer, and simultaneously, the second electrode is formed between each pixel area.

Herein, since the emission layer is not formed on the second electrode, the third electrode is electrically connected to the second electrode.

The method for fabricating the active matrix electroluminescence device according to the present invention further includes forming the first electrodes and the second electrode on a predetermined area of the insulating layer. Herein, the insulating layer includes a trench exposing the second electrode. Furthermore, the third electrode is electrically connected to the second electrode through the trench.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the inventions and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
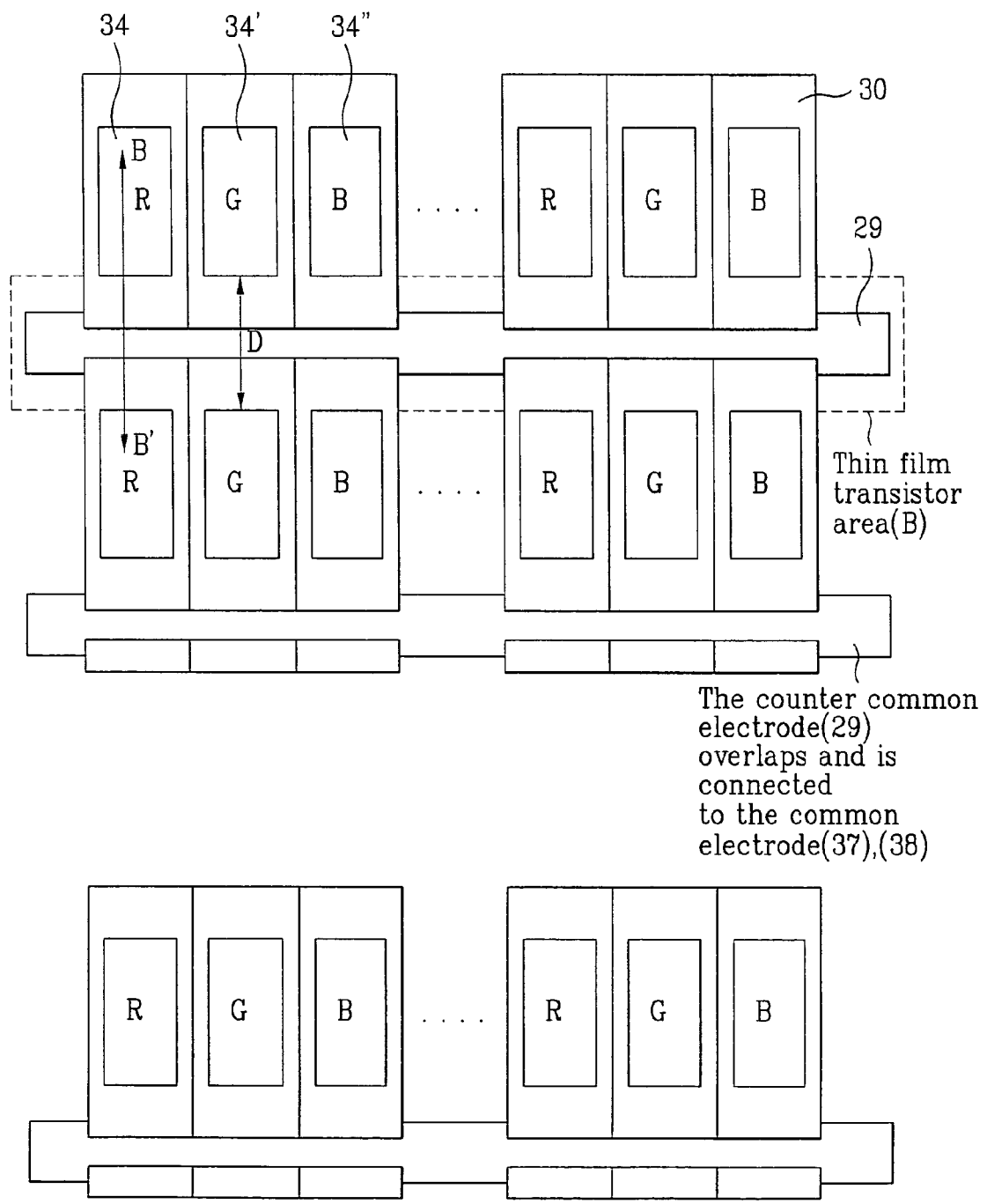
FIG. 1 illustrates a plane view of an active matrix electroluminescence device according to the present invention.

FIG. 1 illustrates a plane view of an active matrix electroluminescence device according to the present invention.

Referring to FIG. 1, the top-emission active matrix electroluminescence device (ELD) according to the present invention includes red (R), green (G), and blue (B) organic electroluminous layer 34, 34', and 34" formed on a pixel area, and a counter common electrode 29 formed in a stripe form on an area outside of the pixel area having the R, G, and B organic electroluminous layers formed thereon. Generally, in the active matrix ELD, a shadow mask is always used when forming the R, G, and B organic electroluminous layers 34, 34', and 34". Herein, the thickness of a bridge of the shadow mask in the range of about 40 to 50 micrometers (μm), which is a space wide enough to form the counter common electrode 29. Since region D of FIG. 1 corresponds to the bridge area of the shadow mask, in the present invention, the counter common electrode 29 is formed in the D region.

The counter common electrode 29 is electrically connected to a common electrode 37 and 38 (i.e., a cathode) through an aperture of an insulating layer 30. And so, most of the electric current flowing through the common electrode 37 and 38 flows to the outside through the counter common electrode 29, which has a lower resistance, thereby resolving the problem of resistance in the common electrode.

Figure 2:
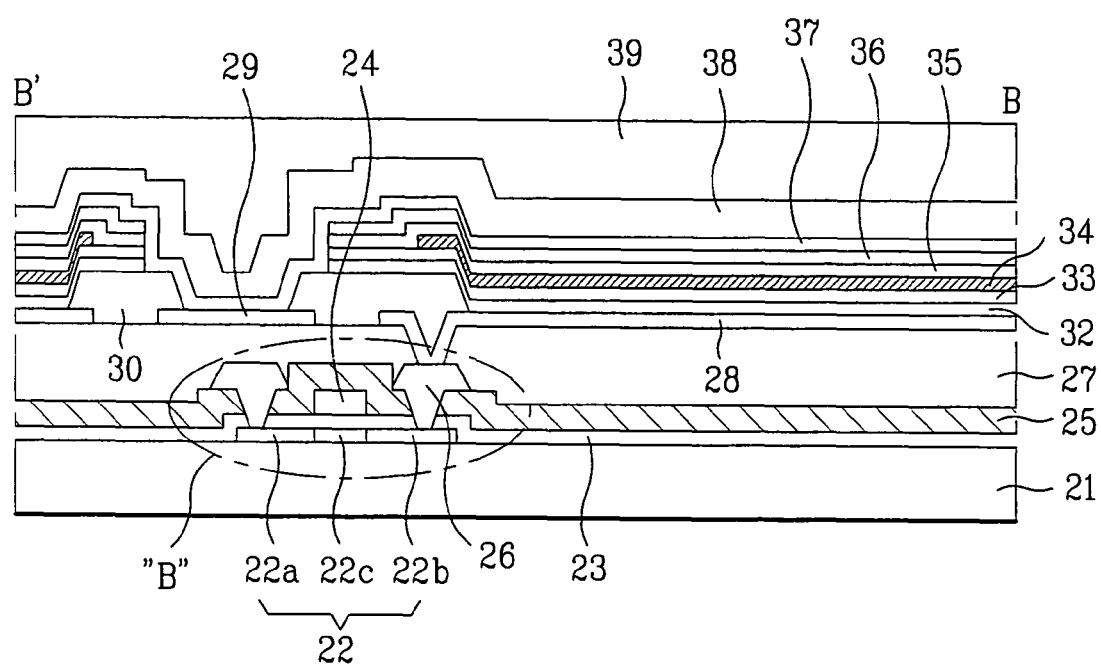
FIG. 2 illustrates a cross-sectional view taken along line B-B' of FIG. 1.

FIG. 2 illustrates a cross-sectional view taken along line B-B' of FIG. 1. The top-emission active matrix electroluminescence device according to the present invention will now be described with reference to FIG. 2.

Referring to FIG. 2, a pixel electrode 28, and a plurality of common electrodes 37 and 38 crossing over the pixel electrode 28 are formed on a glass substrate 21. The common electrode 37 and 38 include a metal common electrode 37 and a transparent common electrode 38 deposited thereon. In addition, an organic electroluminous layer 34 is formed between the pixel electrode 28 and the common electrode 37 and 38. Herein, the organic electroluminous layer 34 is formed in the pixel area.

Additionally, a thin film transistor B is formed on the glass substrate 21 and is electrically connected to the pixel electrode 28. The thin film transistor B includes a semiconductor layer 22 formed on a region of the glass substrate 21 and including source and drain areas 22a and 22b and a channel area 22c, a gate insulating layer 23 formed on the entire surface of the semiconductor layer 22 and the glass substrate 21, a gate electrode 24 formed on the gate insulating layer 23 over the channel area 22c. Herein, the boundaries of the source and drain areas 22a and 22b and the channel area 22c are aligned with both edges of the gate electrode 24.

Moreover, an interlayer dielectric 25 is formed on the thin film transistor B. The interlayer dielectric 25 includes a plurality of contact holes exposing a portion of the surface of the source and drain areas 22a and 22b. A plurality of electrode lines 26 are formed in the contact holes, so as to be electrically connected to the source and drain areas 22a and 22b.

A planarization insulating layer 27 is formed on the entire surface of the interlayer dielectric 25 and the electrode line 26. The planarization insulating layer 27 includes a via hole exposing a portion of the surface of the electrode line 26 connected to the drain area 22b. The pixel electrode 28 is formed on the pixel area of the planarization insulating layer 27. Herein, the pixel electrode 28 is electrically connected to the drain area 22b of the thin film transistor B through the via hole of the planarization insulating layer 27.

A counter common electrode 29 is formed in a stripe form outside of the pixel area of the planarization insulating layer 27 and in a direction parallel to the length of the gate electrode 24 of the thin film transistor B.

An insulating layer 30 formed between the pixel electrode 28 and the counter common electrode 29 overlaps a portion of the pixel electrode 28 and a portion of the counter common electrode 29. The insulating layer 30 is formed to electrically insulate the pixel electrode 28 and the counter common electrode 29, the insulating layer 30 being formed in an area outside of the pixel area.

A hole injection layer 32 and a hole transport layer 33 are serially formed on the pixel electrode 28 and the insulating layer 30, and an organic electroluminous layer 34 is formed on the pixel area of the hole transport layer 33. The organic electroluminous layer 34 includes red (R), green (G), and blue (B) organic electroluminous layers 34, 34', and 34" depending upon the emitted color. The R, G, and B organic electroluminous layers 34, 34', and 34" are serially formed on each of the corresponding pixel areas. Subsequently, an electron transport layer 35 and an electron injection layer 36 are serially deposited on the organic electroluminous layer 34 and the hole transport layer 33.

A metal common electrode 37 and a transparent common electrode 38 are formed on the counter common electrode 29, a portion of the insulating layer 30, and the electron injection layer 36, and a protective layer 39 is formed on the entire surface of the transparent common electrode 38. Herein, since the insulating layer 30, the hole injection layer 32, the hole transport layer 33, the organic electroluminous layer 34, the electron transport layer 35, and the electron injection layer 36 are not formed on the counter common electrode 29, the common electrodes 37 and 38 are contacted with the counter common electrode 29. Alternatively, in the present invention, the metal common electrode 37 can be omitted, thereby allowing the transparent common electrode 38 to be directly contacted with the counter common electrode 39.

The method for fabricating the top-emission active matrix electroluminescence device according to the present invention will now be described with reference to the following drawings.

First Embodiment

Figure 3A:
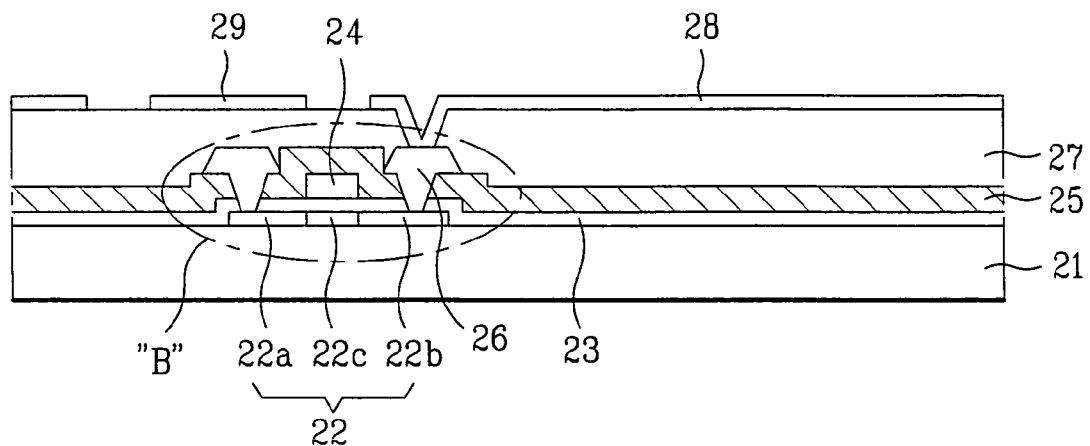
FIGS. 3A to 3G illustrate the process steps of a method for fabricating the active matrix electroluminescence device according to a first embodiment of the present invention.

FIGS. 3A to 3G illustrate the process steps of a method for fabricating the active matrix electroluminescence device according to a first embodiment of the present invention. Referring to FIG. 3A, in order to be used as an active layer of the thin film transistor B, the semiconductor layer 22 is formed on the glass substrate 21 by using a polycrystalline silicon. Subsequently, the semiconductor layer 22 is patterned to leave only a portion of the semiconductor layer 22, corresponding to the area on which the thin film transistor B is to be formed. Then, the gate insulating layer 23 is deposited on the entire surface of the glass substrate 21 and the semiconductor layer 22, and a conductive material layer is deposited on the gate insulating layer 23, so as to form the gate electrode. The conductive material layer is patterned so that only a predetermined portion remains on the patterned semiconductor layer 22, thereby forming the gate electrode 24.

Thereafter, the gate electrode 24 is used as a mask for injecting impurities, such as boron (B) or potassium (P), the semiconductor layer 22, which is then processed with heat-treatment, thereby forming the source and drain areas 22a and 22b of the thin film transistor B. And, the area of the semiconductor layer 22 having no impurities injected therein becomes the channel area 22c. Herein, since the impurities are injected by using the gate electrode 24 as the mask, the boundaries of the source and drain areas 22a and 22b and the boundary of the channel area 22c are aligned with both edges of the gate electrode 24.

The interlayer dielectric 25 is formed on the gate insulating layer 23 and the gate electrode 24. Then, the interlayer dielectric 25 and the gate insulating layer 23 are selectively etched, so as to expose a portion of the upper surface of the source and drain areas 22a and 22b, thereby forming the contact holes. And, the contact holes are filled with metal, so as to form the electrode lines 26 each electrically contacting the source and drain areas 22a and 22b.

Subsequently, an insulating material is deposited on the interlayer dielectric 25 and the electrode lines 26 by using a spin-coating method, thereby depositing the planarization insulating layer 27. The planarization insulating layer 27 is then hardened through a pre-baking process. Furthermore, the planarization insulating layer 27 is selectively removed to expose the electrode line 26 connected to the drain area 22b of the thin film transistor B, thereby forming the via hole.

A metallic material layer is deposited on the entire surface of the via hole and the planarization insulating layer 27. In the bottom-emission ELD, the metallic material layer is formed of a transparent material, such as indium-tin-oxide (ITO). Conversely, in the top-emission ELD, the metallic material layer is formed of a metal having high reflectivity and work function. More specifically, in this case, the metallic material layer is formed of one of or an alloy of chrome (Cr), aluminum (Al), molybdenum (Mo), and silver (Ag)-gold (Au) alloy, and a multi-layer can be formed by using such metals. The metallic material layer deposited on the inner layer of the via hole of the planarization insulating layer 27, is connected to the electrode line 26 formed at the bottom of the via hole.

The metallic material layer is selectively removed so as to form a pixel electrode 28 in each pixel area. And, simultaneously, the counter common electrode 29 is formed in the area outside of the pixel area. The counter common electrode 29 is formed between and spaced apart from the pixel electrodes 28 at a predetermined distance. In other words, the counter common electrode 29 is formed at the boundary area between each pixel electrode on the planarization insulating layer 27. Also, as shown in FIG. 1, the counter common electrode 29 is formed in a stripe form over the thin film transistor B and parallel to the gate electrode 24 of the thin film transistor B.

Figure 3B:
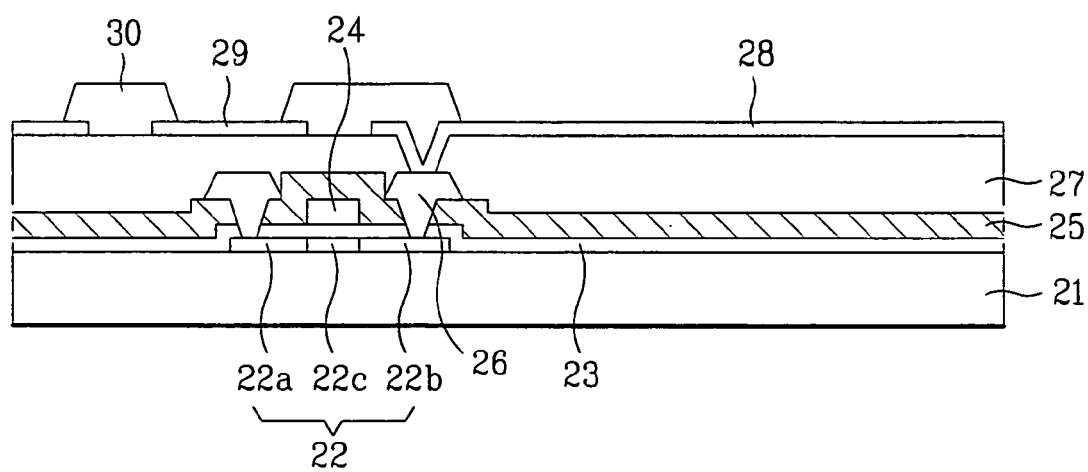

Referring to FIG. 3B, after depositing an insulating material on the entire surface of the planarization insulating layer 27, the pixel electrodes 28, the counter common electrode 29, the insulating material layer is selectively removed, so as to form the insulating layer 30 on an area excluding the pixel area, more specifically, on the boundary area between the pixel areas. At this point, the insulating layer 30 is also not formed on a portion of the surface of the counter common electrode 29. In other words, the insulating layer 30 formed between the pixel electrode 28 and the counter common electrode 29 overlaps only a portion of each of the pixel electrode 28 and the counter common electrode 29. In order to expose a portion of the surface of the counter common electrode 29, the insulating layer 30 includes a trench formed on the counter common electrode 29 in the same direction as the length the counter common electrode 29.

Figure 3C:
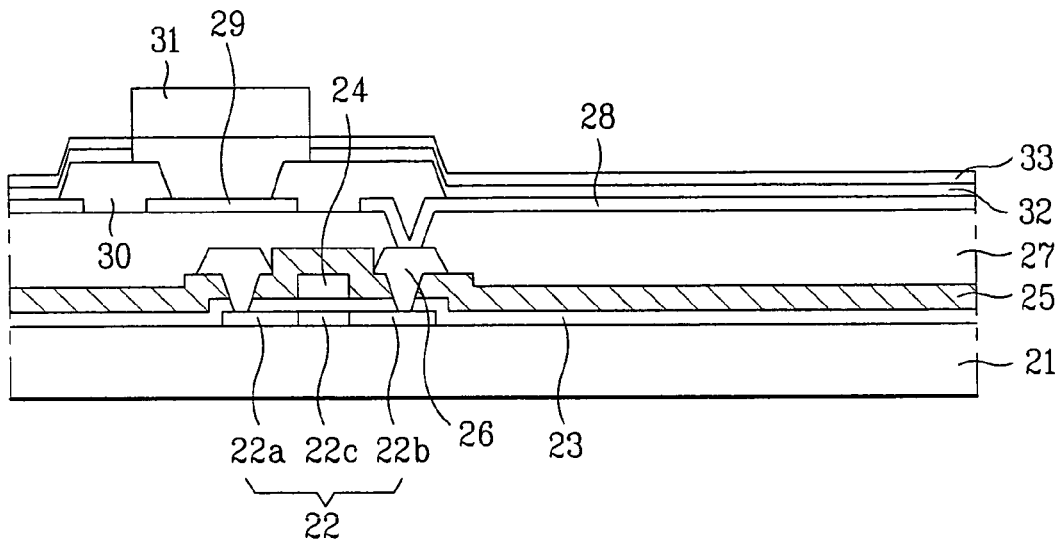
Figure 4:
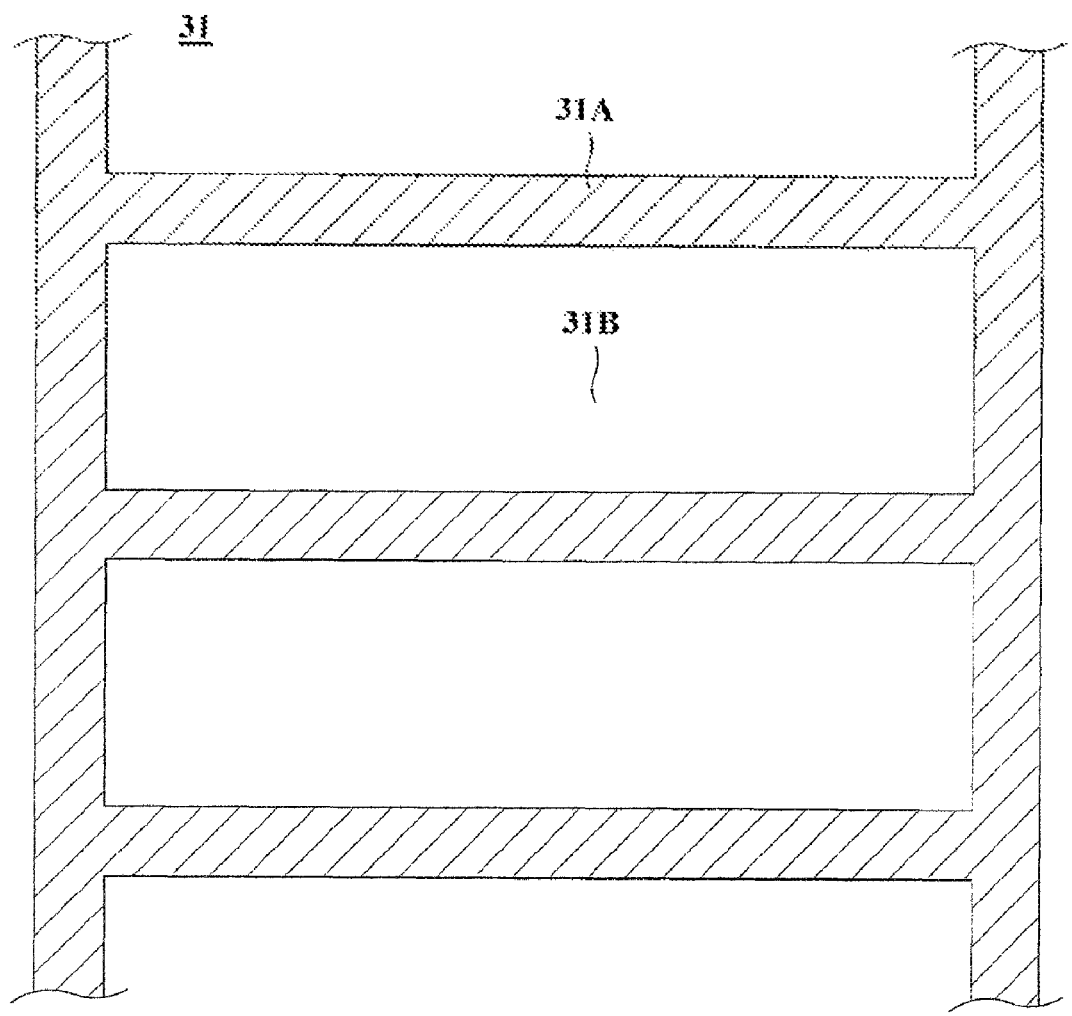
FIG. 4 illustrates a shadow mask according to the present invention.

Subsequently, an emission layer is formed on the pixel electrode 28. Herein, the emission layer is formed of the hole injection layer 32, the hole transport layer 33, the organic electroluminous layer 34, the electron transport layer 35, and the electron injection layer 36 serially deposited thereon. Referring to FIG. 3C, opening portions 31B of the shadow mask 31 is used to serially deposit the hole injection layer 32 and the hole transport layer 33 on the pixel electrode 28 and the insulating layer 30. The hole injection layer 32 and the hole transport layer 33 is not necessarily deposited on the counter common electrode 29. FIG. 4 illustrates a portion of the surface of the shadow mask 31. Herein, the shadow mask 31 has a plurality of stripes (masking portions) 31A being aligned with a pattern of the counter common electrode 29 and opening portions 31B between the stripes 31A, wherein the opening portions 31B is stripe type which is parallel to the stripes 31A.

Figure 3D:
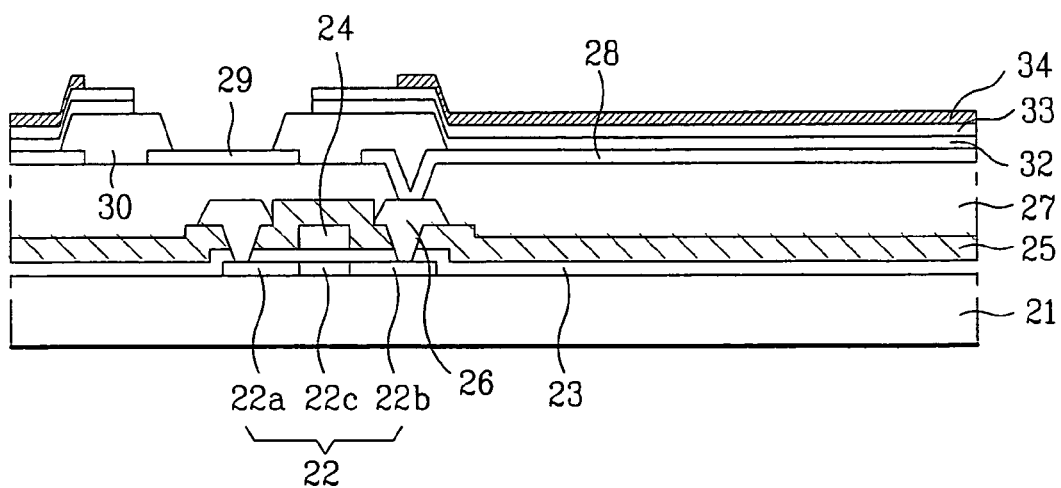

Referring to FIG. 3D, a shadow mask (not shown) is used to deposit the organic electroluminous layer 34 on the hole transport layer 33. The organic electroluminous layer 34 includes red (R), green (G), and blue (B) organic electroluminous layers 34, 34', and 34" depending upon the emitted color. The R, G, and B organic electroluminous layers 34, 34', and 34" are serially formed on each of the corresponding pixel areas. Herein, the organic electroluminous layer 34 is deposited only in the pixel area.

Figure 3E:
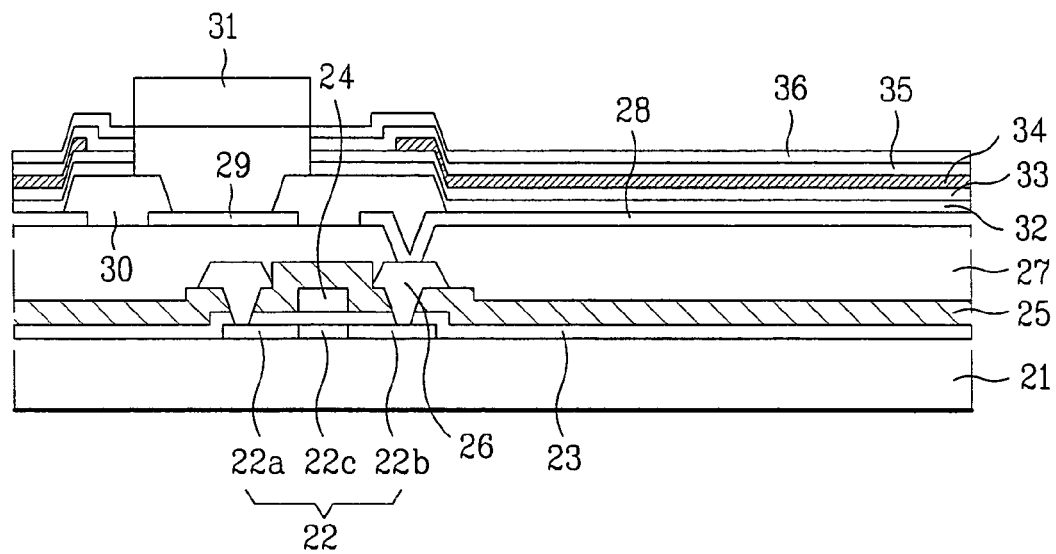

As shown in FIG. 3E, the opening portions 31B of the shadow mask 31 is used to serially deposit the electron transport layer 35 and the electron injection layer 36 on a portion of the hole transport layer 33 and the organic electroluminous layer 34.

Figure 3F:
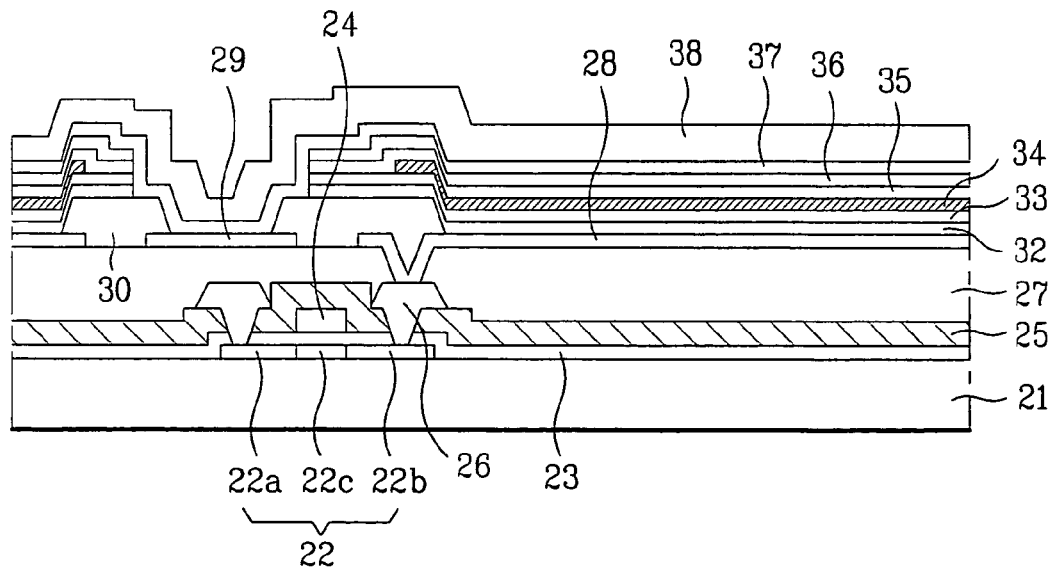

Referring to FIG. 3F, the common electrode 37 and 38 is formed on the entire surface of the electron injection layer 36 and the counter common electrode 29. Since the common electrode is electrically connected to the counter common electrode 29, the electric current flowing through the common electrode is flown out through the counter common electrode 29, which has a smaller resistance, thereby resolving the resistance-related problem of the common electrode. The common electrode includes the metal common electrode 37 and the transparent common electrode 38. In order to form the metal common electrode 37, an aluminum (Al) layer having the thickness of several nanometers (nm) is deposited on the entire surface of the electron injection layer 36 and the counter common electrode 29, which is then etched to have a thickness equal to or less than 5 nanometers (nm). Alternatively, a layer of a $Mg_xAg_{x-1}$ metal group having a thickness equal to or less than 5 nanometers (nm) can be deposited instead of the aluminum layer. On the other hand, another method for forming the metal common electrode 37 is to serially deposit a lithium fluoride (LiF) layer having a thickness of about 0.5 nanometers (nm) and an aluminum (Al) layer of about 1 nanometer (nm). In addition, the transparent common electrode 38 is formed of a transparent conductive material, such as indium tin oxide (ITO) or indium zinc oxide (IZO).

The metal common electrode 37 may be omitted, and the transparent common electrode 38 may be formed to be electrically connected to the counter common electrode 29, instead of the metal common electrode 37.

Figure 3G:
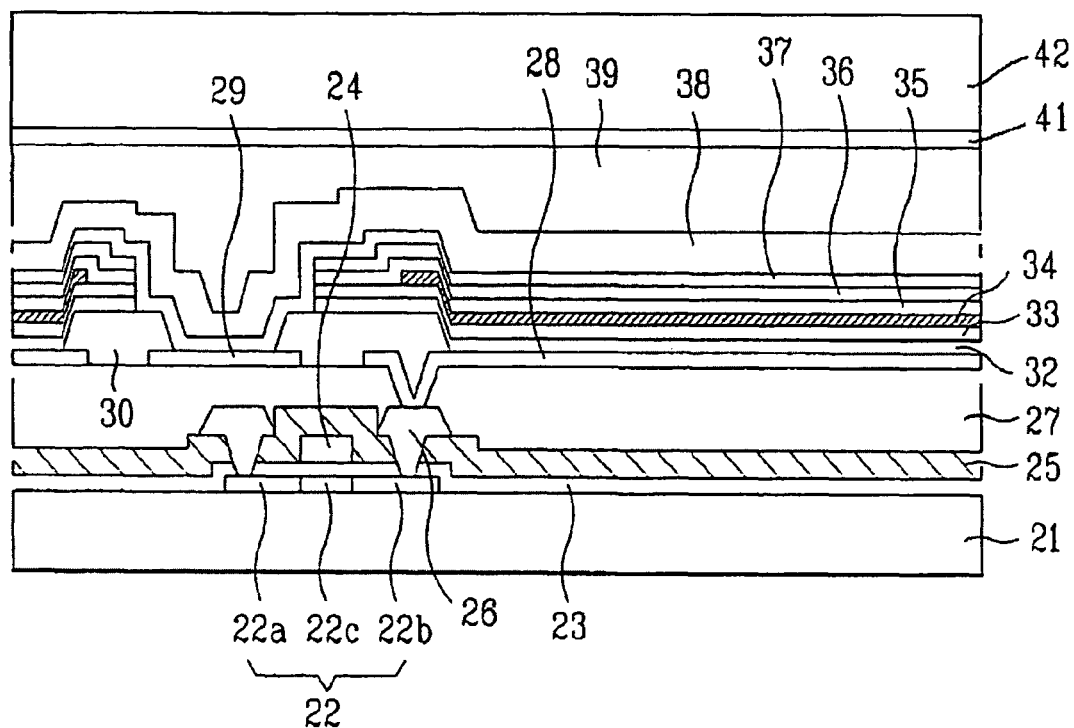

Thereafter, as shown in FIG. 3G, a protective layer 39 is formed to protect the organic electroluminous layer 34, the electron transport layer 35, and the electron injection layer 36 from oxygen or moisture. Also, a protective cap 40 is mounted on the protective layer 39 by using a sealant 41 and a transparent substrate 42, thereby completing the top-emission active matrix electroluminescence device according to the present invention.

Second Embodiment

Figure 5A:
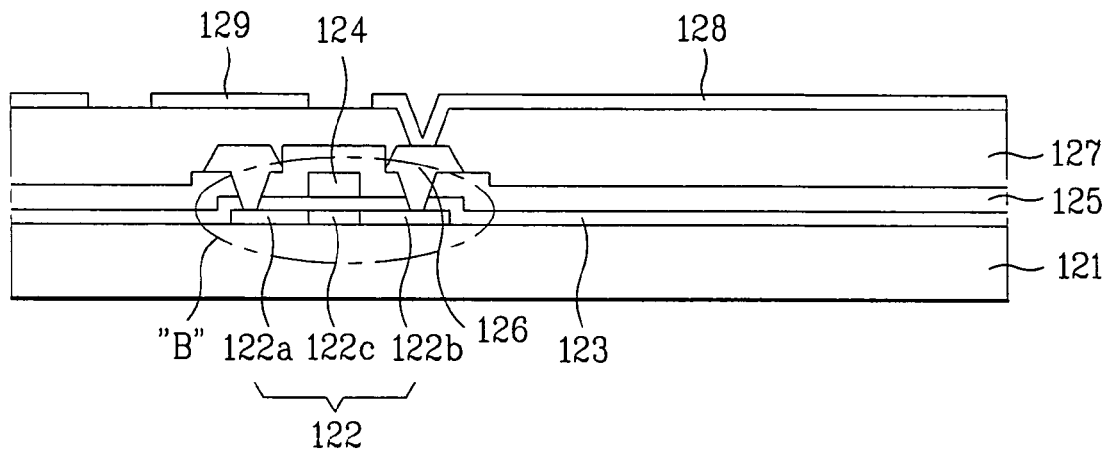
FIG. 5A to 5F illustrate the process steps of a method for fabricating the active matrix electroluminescence device according to a second embodiment of the present invention.

FIGS. 5A to 5F illustrate the process steps of a method for fabricating the active matrix electroluminescence device according to a second embodiment of the present invention. Referring to FIG. 5A, the semiconductor layer 122 is formed on the glass substrate 121 in order to be used as an active layer of the thin film transistor B. The semiconductor layer 122 is made of poly-silicon. Subsequently, the semiconductor layer 122 is patterned to leave only a portion of the semiconductor layer 122, corresponding to the area on which the thin film transistor B is to be formed. Then, the gate insulating layer 123 is deposited on the entire surface of the glass substrate 121 and the semiconductor layer 122, and a conductive material layer is deposited on the gate insulating layer 123, so as to form the gate electrode. The conductive material layer is patterned so that only a predetermined portion remains on the patterned semiconductor layer 122, thereby forming the gate electrode 24.

The gate electrode 24 is used as a mask for injecting impurities, such as boron (B) or potassium (P), and the semiconductor layer 122, which is then processed with heat-treatment in order to the source and drain areas 122a and 122b of the thin film transistor B. The area of the semiconductor layer 122 having no impurities injected therein becomes the channel area 122c. Herein, since the impurities are injected by using the gate electrode 124 as the mask, the boundaries of the source and drain areas 122a and 122b and the boundary of the channel area 122c are aligned with both edges of the gate electrode 124.

The interlayer dielectric 125 is formed on the gate insulating layer 123 and the gate electrode 124. Then, the interlayer dielectric 125 and the gate insulating layer 123 are selectively etched, so as to expose a portion of the upper surface of the source and drain areas 122a and 122b, thereby forming the contact holes. And, the contact holes are filled with metal, so as to form the electrode lines 126 each electrically contacting the source and drain areas 122a and 122b.

Subsequently, an insulating material is deposited on the interlayer dielectric 125 and the electrode lines 126 by using a spin-coating method, thereby depositing the planarization insulating layer 127. The planarization insulating layer 127 is then hardened through a pre-baking process. Furthermore, the planarization insulating layer 127 is selectively removed to expose the electrode line 126 connected to the drain area 122b of the thin film transistor B, thereby forming the via hole.

A metallic material layer is deposited on the entire surface of the via hole and the planarization insulating layer 127. In the bottom-emission ELD, the metallic material layer is formed of a transparent material, such as indium-tin-oxide (ITO). Conversely, in the top-emission ELD, the metallic material layer is formed of a metal having high reflectivity and work function. More specifically, in this case, the metallic material layer is formed of one of or an alloy of chrome (Cr), aluminum (Al), molybdenum (Mo), and silver (Ag)-gold (Au) alloy, and a multi-layer can be formed by using such metals. The metallic material layer deposited on the inner layer of the via hole of the planarization insulating layer 127, is connected to the electrode line 126 formed at the bottom of the via hole.

The metallic material layer is selectively removed so as to form a pixel electrode 128 in each pixel area. And, simultaneously, the counter common electrode 129 is formed in the area outside of the pixel area. The counter common electrode 129 is formed between and spaced apart from the pixel electrodes 128 at a predetermined distance. In other words, the counter common electrode 129 is formed at the boundary area between each pixel electrode on the planarization insulating layer 127. The counter common electrode 129 is formed in a stripe form over the thin film transistor B and parallel to the gate electrode 124 of the thin film transistor B.

Figure 5B:
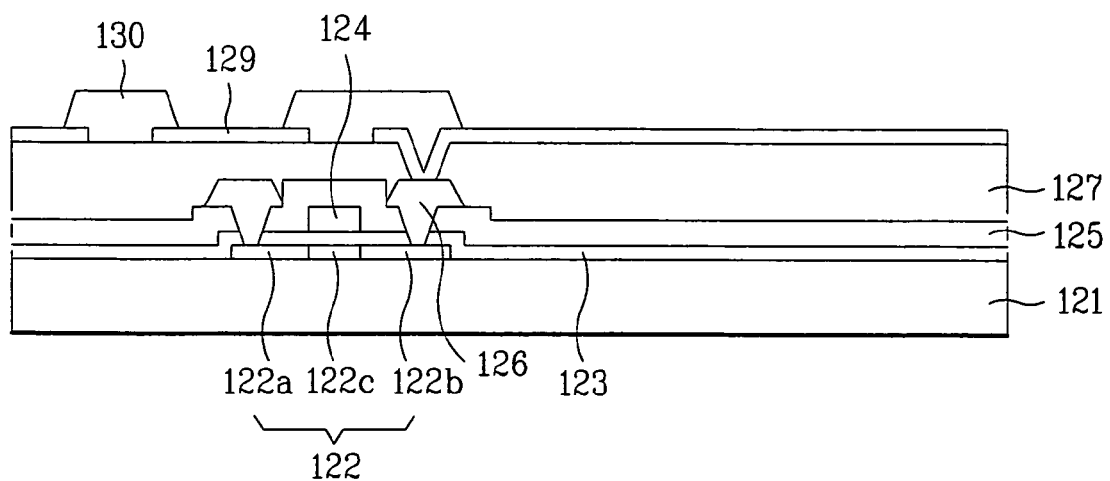

Referring to FIG. 5B, after depositing an insulating material on the entire surface of the planarization insulating layer 127, the pixel electrodes 128, the counter common electrode 129, the insulating material layer is selectively removed, so as to form the insulating layer 130 on an area excluding the pixel area, more specifically, on the boundary area between the pixel areas. At this point, the insulating layer 130 is also not formed on a portion of the surface of the counter common electrode 129. In other words, the insulating layer 130 formed between the pixel electrode 128 and the counter common electrode 129 overlaps only a portion of each of the pixel electrode 128 and the counter common electrode 129. In order to expose a portion of the surface of the counter common electrode 129, the insulating layer 130 includes a trench formed on the counter common electrode 129 in the same direction as the length the counter common electrode 129.

Figure 5C:
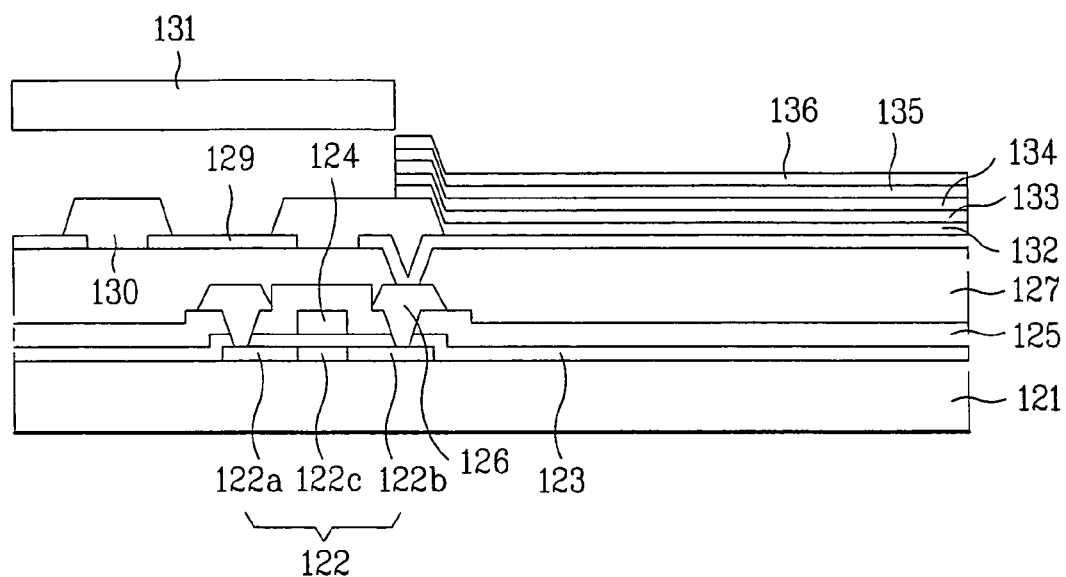
Figure 5D:
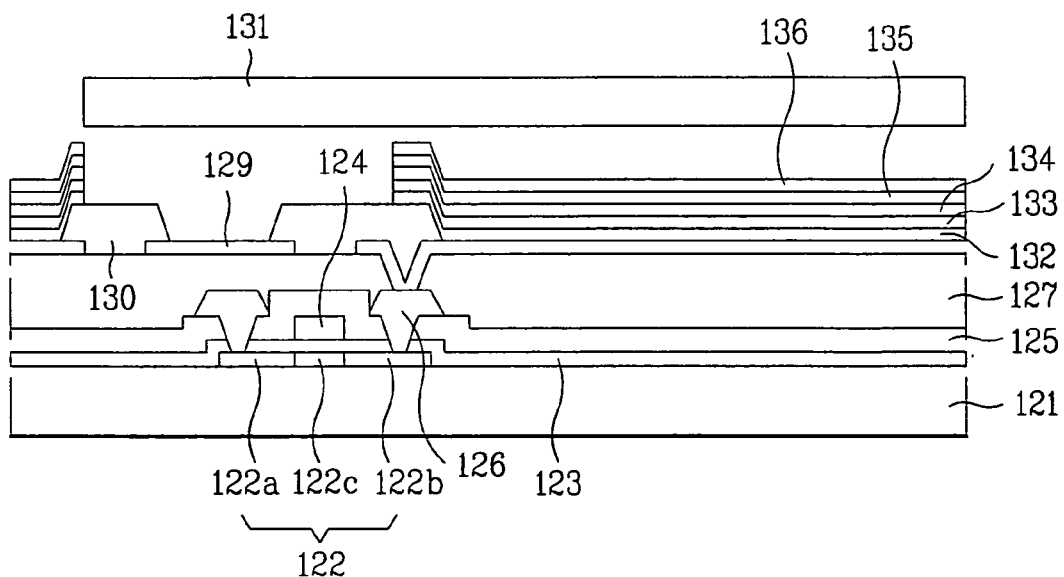

Subsequently, an emission layer is formed on the pixel electrode 128. Herein, the emission layer is formed of the hole injection layer 132, the hole transport layer 122, the organic electroluminous layer 134, the electron transport layer 135, and the electron injection layer 136 serially deposited thereon. Referring to FIG. 5C, the shadow mask 131 is used to serially deposit the hole injection layer 132, the hole transport layer 133, the organic electroluminous layer 134, the electron transport layer 135, and the electron injection layer 136 on the pixel electrode 128 and a portion of the insulating layer 130. The organic electroluminous layer 134 includes red (R), green (G), and blue (B) organic electroluminous layers depending on the emitted color. Referring to FIG. 5d, the R, G, and B organic electroluminous layers are serially formed on each of the corresponding pixel areas using the shadow mask 131. Herein, the hole injection layer 132, the hole transport layer 133, the organic electroluminous layer 134, the electron transport layer 135, and the organic electroluminous layer 134 are deposited only in the pixel area.

Figure 5E:
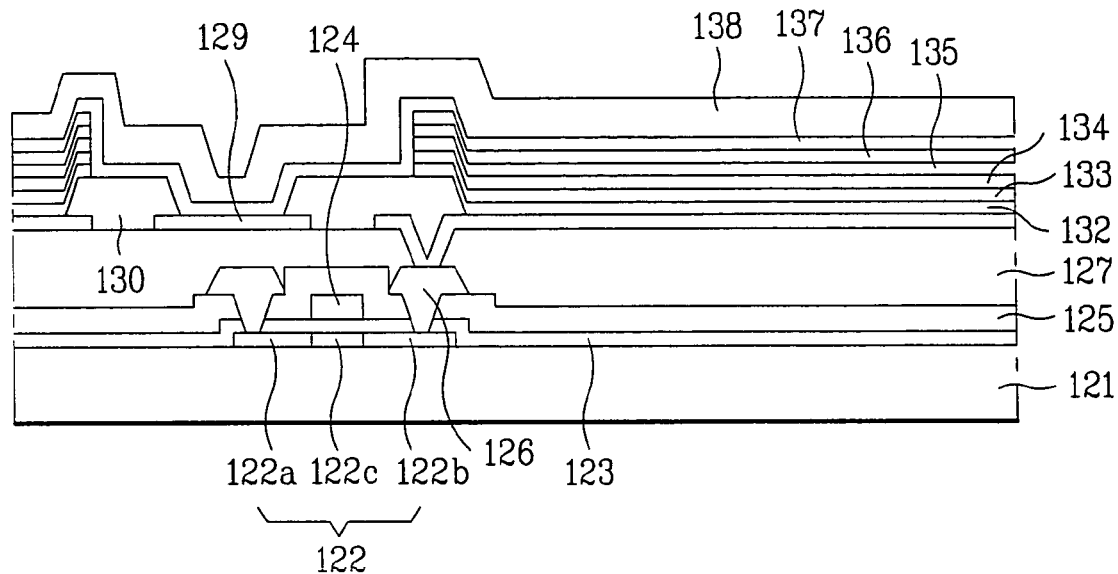

Referring to FIG. 5E, common electrode 137 and 138 is formed on the entire surface of the electron injection layer 136, a portion of the insulating layer 130, and the counter common electrode 129. Since the common electrode is electrically connected to the counter common electrode 129, the electric current flowing through the common electrode is flown out through the counter common electrode 129, which has a smaller resistance, thereby resolving the resistance-related problem of the common electrode. The common electrode includes the metal common electrode 137 and the transparent common electrode 138. In order to form the metal common electrode 137, an aluminum (Al) layer having the thickness of several nanometers (nm) is deposited on the entire surface of the electron injection layer 136, the portion of the insulating layer 130, and the counter common electrode 129. A silver layer or a layer of a MgxAgx-1 metal group having a thickness equal to or less than 5 nanometers (nm) is deposited on the aluminum layer. Another method for forming the metal common electrode 137 is to serially deposit a lithium fluoride (LiF) layer having a thickness of about 0.5 nanometers (nm) and an aluminum (Al) layer of about 1 nanometer (nm). In addition, the transparent common electrode 138 is formed of a transparent conductive material, such as indium tin oxide (ITO) or indium zinc oxide (IZO).

Figure 5F:
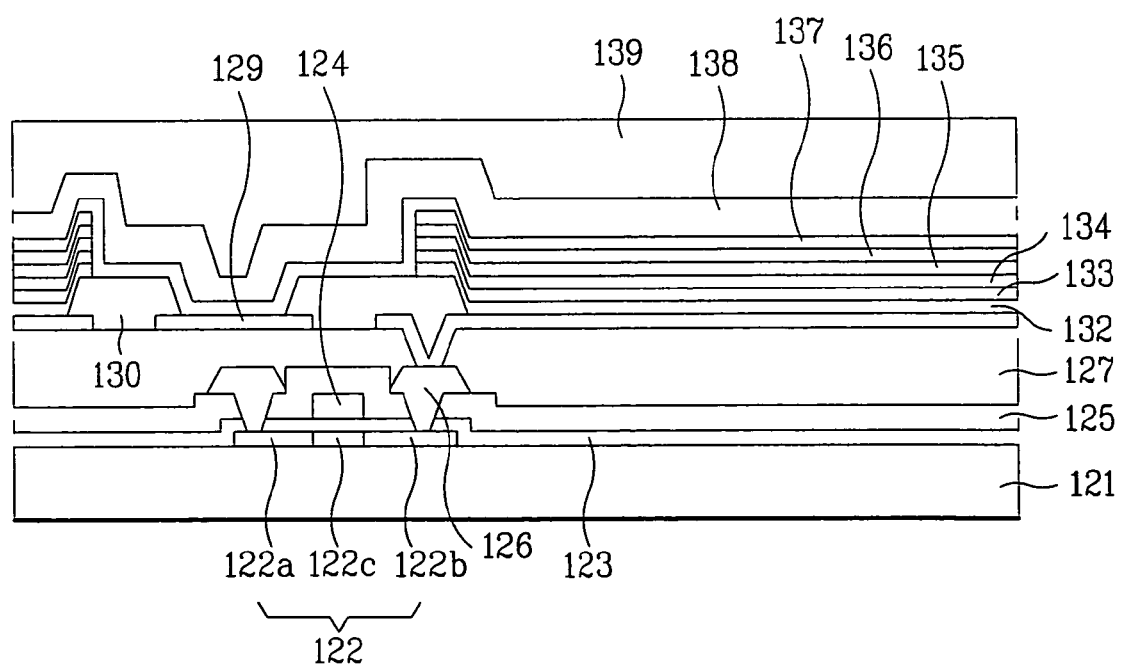
Figure 5F:
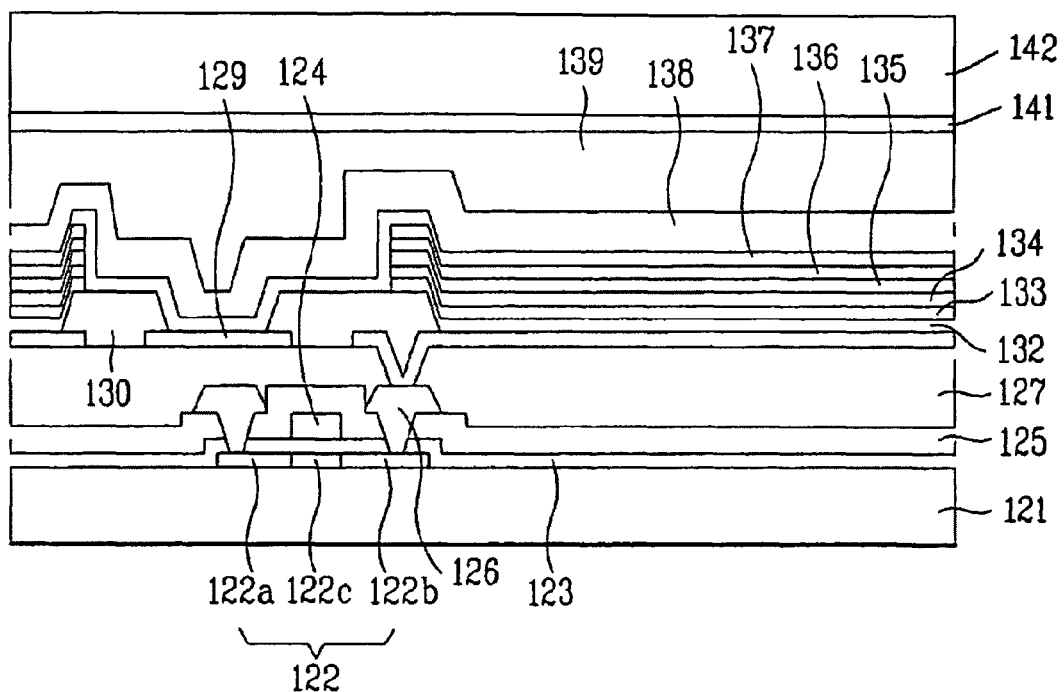

Thereafter, as shown in FIG. 5F, a protective layer 139 is formed to protect the organic electroluminous layer 134, the electron transport layer 135, and the electron injection layer 136 from oxygen or moisture. Also, a protective cap 140 is mounted on the protective layer 139 by using a sealant 141 and a transparent substrate 142, thereby completing the top-emission active matrix electroluminescence device according to the present invention.

As described above, in the top-emission active matrix electroluminescence device according to the present invention, since a counter common electrode is formed to be electrically connected to a common electrode, the electric current flow can be facilitated even though the metal common electrode is formed to be thin. Moreover, due to the thinness of the metal common electrode, the light transmissivity can be enhanced. Thus, a top-emission active matrix electroluminescence device having an improved durability and an enhanced reliability can be provided.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An active matrix electroluminescence device, comprising:
    a substrate including a thin film transistor and a pixel area defined thereon;
    first insulating layer formed on the substrate and the thin film transistor;
    a first electrode formed on the first insulating layer of the pixel area;
    a second electrode formed on the first insulating layer between the first electrodes, wherein the second electrode is formed in a stripe type between adjacent pixel areas and is formed on the first insulating layer which is located above the thin film transistor and at least partially overlaps the thin film transistor, wherein the second electrode overlapping the thin film transistor is formed at the same height and on the same layer as the first electrode;
    a second insulating layer formed on a predetermined area on the first electrode and the second electrode, wherein the second insulating layer includes a trench formed along a direction of the second electrode;
    an emission layer formed on each of the first electrodes; and
    a third electrode formed on the emission layer and electrically connected to the second electrode through the trench of the second insulating layer, wherein the second electrode has a resistance lower than the third electrode;
    wherein the third electrode includes a metal common electrode and a transparent common electrode for transmitting light from the emission layer, wherein the metal common electrode transmitting light is formed to serially deposited a lithium fluoride (LiF) layer having a thickness of about 0.5 nanometers (nm) and an aluminum (Al) layer of about 1 nanometer (nm) and the transparent common electrode is formed of a transparent conductive material,
    wherein the emission layer is formed of a hole injection layer, a hole transport layer, an organic electroluminous layer, an electron transport layer, and an electron injection layer serially deposited on one another,
    wherein the hole injection layer, the hole transport layer, the electron transport layer and the electron injection layer are formed in a stripe type between adjacent second electrodes of the stripe type so that the hole injection layer, the hole transport layer, the electron transport layer and the electron injection layer are not formed on the second electrode,
    wherein the organic electroluminous layer is formed only in the pixel area different from the stripe type,
    wherein the hole transport layer directly contacts with the electron transport layer on the second insulating layer.

2. The device according to claim 1, wherein the first electrode is connected to the thin film transistor through a contact hole within the first insulating layer.

3. The device according to claim 1, wherein the first electrode is formed on the pixel area, and the second electrode is formed in a boundary area between the pixel area and another pixel area.

4. The device according to claim 1, further comprising:
    a protective layer directly formed on the third electrode and contacting with the third electrode, the protective layer having a upper flat surface; and
    a protective cap is directly formed on the protective layer and contacting with the protective layer, the protective cap including a sealant and a transparent substrate.

5. The device according to claim 1, wherein the emission layer is not formed on the second electrode.

6. The device according to claim 1, wherein the third electrode is formed of a metal electrode deposited over a transparent electrode.

7. The device according to claim 1, wherein the third electrode is formed of a transparent electrode.

8. The device according to claim 1, wherein the second electrode overlaps at least one of a drain or source of the thin film transistor but does not overlap the other of the drain or source of the thin film transistor.

9. The device according to claim 1, wherein the second electrode overlaps a gate of the thin film transistor.

10. The device according to claim 1, wherein the first electrode and the second electrode are at least substantially coplanar.

11. The device according to claim 1, wherein the second electrode is formed outside of a region that includes the pixel region.

12. The device according to claim 1, wherein the third electrode carries current to the second electrode having said lower resistance outside the pixel region.

* * * * *